United States Patent [19]
Johnson

[11] Patent Number: 5,327,139
[45] Date of Patent: Jul. 5, 1994

[54] ID MICROWAVE HOLOGRAPHIC SENSOR

[75] Inventor: Walter J. Johnson, Renton, Wash.

[73] Assignee: The Boeing Company, Seattle, Wash.

[21] Appl. No.: 944,163

[22] Filed: Sep. 11, 1992

[51] Int. Cl.$^5$ .............................................. G01S 13/04
[52] U.S. Cl. ....................................... 342/22; 342/27
[58] Field of Search ..................................... 342/22, 27

[56] References Cited

U.S. PATENT DOCUMENTS

| | | | |
|---|---|---|---|
| 4,698,634 | 10/1987 | Alongi et al. | 342/22 |
| 4,803,489 | 2/1989 | Giori | 342/192 |
| 4,831,383 | 5/1989 | Ohnishi et al. | 342/22 |
| 4,839,654 | 6/1989 | Ito et al. | 342/22 |
| 4,896,116 | 1/1990 | Nagashima et al. | 324/329 |
| 4,937,580 | 6/1990 | Wills | 342/22 |
| 4,951,055 | 8/1990 | Katayama | 342/22 |
| 5,012,248 | 4/1991 | Munro et al. | 342/22 |
| 5,081,456 | 1/1992 | Michiguchi et al. | 342/22 |
| 5,130,711 | 7/1992 | Kimura et al. | 342/22 |
| 5,153,595 | 10/1992 | Harmuth | 342/22 |
| 5,159,343 | 10/1992 | Harmuth | 342/22 |

OTHER PUBLICATIONS

J. Durnin, "Exact Solutions for Nondiffracting Beams," The Scaler Theory, J. Opt. Soc. Am. A, vol. 4, No. 4, pp. 651–661, (Apr. 1987).
J. Durnin et al., "Diffraction Free Beams," Physical Review Letters, vol. 48, p. 1499, (Apr. 1987).
D. A. Hill, "Electromagnetic Scattering by Buried Objects of Low Contrast," IEEE Trans. Geosci. Remote Sensing, vol. 26, pp. 195–203, (Mar. 1988).
D. A. Hill, "Near-Field Detection of Buried Dielectric Objects," IEEE Trans. Geosci. Remote Sensing, vol. 26, pp. 364–368, (Mar. 1988).
C. C. Chan et al., "Beam phenomena at and near critical incidence upon dielectric interference," J. Opt. Soc. Am.A, vol. 4, No. 4, pp. 655–663, (Apr. 1987).
O.P. Gupta et al., "Scale Model Experiments to Study Low-Frequency Electromagnetic Resolution of Multiple Conductors," IEEE Trans. Geosci. Remote Sensing, vol. 26, No. 2, pp. 187–194, (Mar. 1988).
D. M. Kerns, *Plane-Wave Scattering Matrix Theory of Antennas and Antenna-Antenna Interactions*, Nat'l. Bureau of Standards, NBS Monograph 162, Jun. 1981.

*Primary Examiner*—John B. Sotomayor
*Attorney, Agent, or Firm*—Foley & Lardner

[57] ABSTRACT

A method and apparatus for measuring both physical and electrical properties of a dielectric object using sequential spatial and spectral microwave data. The apparatus is a step CW microwave transmitter and receiver with a spatially modulated antenna positioned linearly in the Poynting vector direction. The method removes the antenna dispersion, removes the antenna image, transfers the image plane to the surface, removes diffraction and then removes the nuisance multipath by spatially integrating along the Poynting vector. The result is a clean complex surface reflection coefficient that contains only the subsurface or object plane information. This clean complex surface reflection coefficient may be compared to reflection coefficients of known objects in order to ascertain physical characteristics of the object.

11 Claims, 6 Drawing Sheets

ID MICROWAVE HOLOGRAPHIC SENSOR

This invention was made with Government support under grant number H0398009 awarded by the Department of the Interior. The Government has certain rights in this invention.

BACKGROUND OF THE INVENTION

The present invention is directed to a method of detecting an object by employing electromagnetic radiation. More particularly, the invention concerns using radio waves for identifying a depth and material of an object buried in the earth, although application of the invention is not limited thereto.

Ground penetration radar technology has the potential to be of great use, for example, in geographical exploration to locate deposits of minerals, such as coal.

Two fundamental problems which have plagued ground penetration radar technology are penetration and focus. Electromagnetic waves of low frequency can penetrate the ground, but the use of low frequencies degrades the ability of the system to resolve small objects. Further, when the electro-magnetic waves do penetrate, the returned signal reverberates (reflection jitter) and is out of focus. Media dispersion coupled with antenna and target dispersion can additionally degrade radar performance.

One of the major problems in object detection is that the antenna interferes with a true measurement, as in the old galvanometer problem, wherein when an unknown resistor is to be measured, part of the reading is due to the meter's internal resistance. The same is true for all ground penetrating radar, only it is more complex. Obtaining a true measurement is hindered for reasons including: the fact that the height of the antenna above the ground affects impedance, the antenna looks like a target because of self reflection, and the dispersion within the antenna distorts all the variables.

Prior attempts to improve resolution have been to increase bandwidth by using impulse radars. However, this has only compounded the problem of dispersion correction. Another trick was to increase the bandwidth in the time domain by using a resistive antenna. This type of antenna has more bandwidth with less dispersion, but operates at a great cost of efficiency, and, moreover, does not solve the ground interaction problem.

An illustration of the ground radar penetrating problem is shown in FIGS. 1(a) and 1(b). The source 10 is accordance with space, phase, frequency, electric currents and magnetic currents. The unknown medium 12 is defined in accordance with permittivity, permeability, space, phase and frequency. Source 10 has definable currents (a) which generate unique fields (b) in the sub surface 16. These fields induce both electric and magnetic currents (c) in the targets 18, which are any dielectric anomaly in the ground. These targets generate fields (d) in space that the source can receive. The process from (a) to (c) is unique assuming a single source 10. But since the number of targets, i.e., sources below surface 14, is unknown, the process from (c) to (d) is not unique unless all possibilities of space, phase and frequency are sampled.

Such problems and some related solutions are discussed in the following articles, which are herein incorporated by reference: J. Durnin, "Exact Solutions for Nondiffracting Beams, The Scaler Theory," J. Opt. Soc. Am. A, vol. 4, no. 4, pp. 651–661, (April 1987); J. Durnin et al., "Diffraction Free Beams," Physical Review Letters, vol. 48, p. 1499, (April 1987); D. A. Hill, "Electromagnetic Scattering by Buried Objects of Low Contrast," IEEE Trans. Geosci. Remote Sensing, vol. 26, pp. 195–203, (March 1988); and D. A. Hill, "Near-Field Detection of Buried Dielectric Objects," IEEE Trans. Geosci. Remote Sensing, vol. 26, pp. 364–368, (March 1988). The following book is also incorporated by reference: D. M. Kerns, *Plane-Wave Scattering-Matrix Theory of Antennas and Antenna-Antenna Interactions*, National Bureau of Standards, NBS Monograph 162, June 1981.

The complexity of electromagnetic waves has caused designers to oversimplify the systems. A radar system must have enough degrees of freedom to be able to solve the complex sensor problem. The method of the present invention uses the additional tool of spatial modulation. Synthetic aperture radars have long used spatial modulation to resolve multiple targets in a single real beam width. The present invention also uses the spatial domain to reject unwanted reflections from sources other than the target and to aid in canceling out antenna dispersion.

SUMMARY OF THE INVENTION

An object of the present invention is to obtain the maximum information from the medium and the targets without sampling the entire space and spectrum.

A further object of the present invention is to provide a method for characterizing a target within a medium by radiating an electro-magnetic wave towards the medium, varying the frequency of the electro-magnetic wave, measuring signals reflected from the ground at a plurality of frequencies for a single perpendicular distance from the medium from which the electro-magnetic wave is radiating, processing the measured signals to obtain a reflection coefficient dependent on both a frequency of the electro-magnetic wave and the perpendicular distance, repeating the two previous steps for a predetermined number of perpendicular distances, averaging the reflection coefficients over the predetermined number of perpendicular distances, integrating the averaged reflection coefficients over space, which results in a true reflection coefficient which is only a function of frequency. This true reflection coefficient can then be compared with theoretical reflection coefficients in order to thereby determine a characterization of the target.

BRIEF DESCRIPTION OF THE DRAWINGS

The invention will be described in further detail with reference to the accompanying drawings, wherein.

DETAILED DESCRIPTION OF THE PREFERRED EMBODIMENTS

Figure 1A:
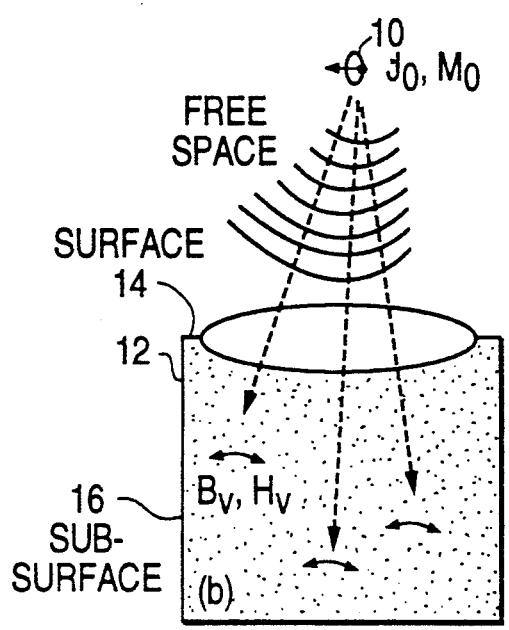
FIGS. 1(a) and 1(b) illustrate the ground penetrating radar problem.
Figure 1B:
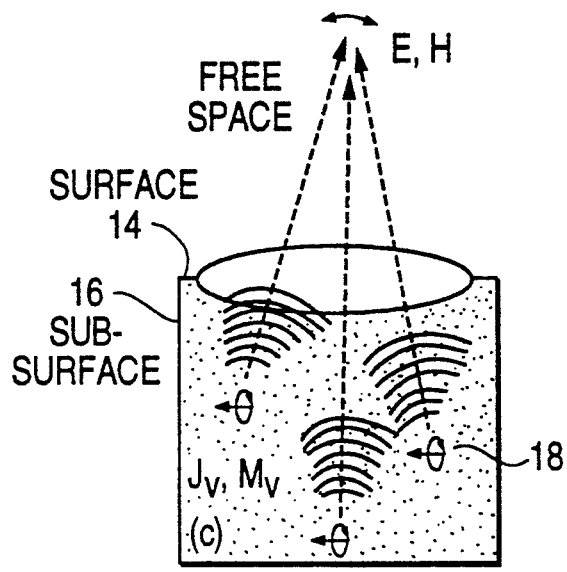
Figure 2A:
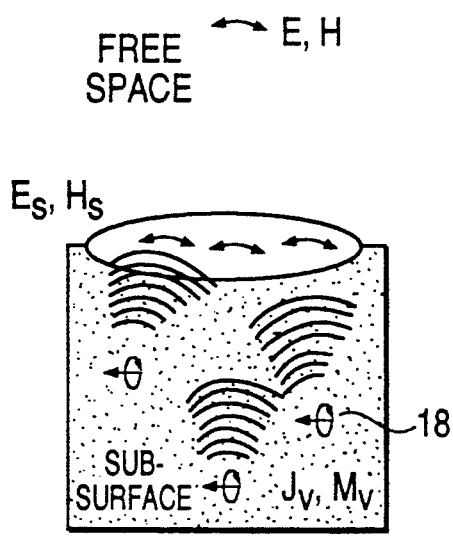
FIGS. 2(a) and 2(b) illustrate the Love equivalence principle.
Figure 2B:
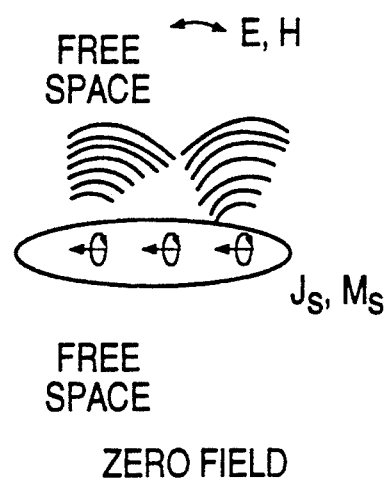

In order to manage the complex sensor problem and obtain the maximum information from the medium and the targets, absent sampling the entire space and spectrum, the sensor problem is first separated from the target interpretation problem. Rather than trying to solve a three-dimensional permittivity/permeability problem, the Love equivalence principle is evoked and superposition used to reduce the sensor problem to two dimensions in free space, as illustrated in FIGS. 2(a) and 2(b). In FIG. 2(a), sub surface sources are distributed in a medium, conceivably a nonlinear and anisotropic material. These sources will generate a unique field on the surface equivalent to that shown in FIG. 2(b), in which the surface area is the same as in FIG. 2(a), the fields above the surface are the same as in FIG. 2(a), and the fields below the surface are zero, when the new surface currents are equal to the normal curl of the original surface fields. In other words, these two depictions are the same if:

$$J_s = \hat{n} \times H_s \quad (1)$$

and $$M_s = -\hat{n} \times E_s \quad (2)$$

where $J_s$ is the surface electric current, $H_s$ is the surface magnetic field, $M_s$ is the surface magnetic current, $E_s$ is the electric field at the surface, and n is the unit vector normal to the surface. With this equivalence, the sensor problem is reduced to measuring the complex surface currents in the frequency domain, since the information for subsurface targets is contained in the ground surface reflection coefficient. Measuring the surface coefficient at one spot on the ground is effected by an ID holographic image and, for some targets, like layered media, this is all that is needed.

Figure 3A:
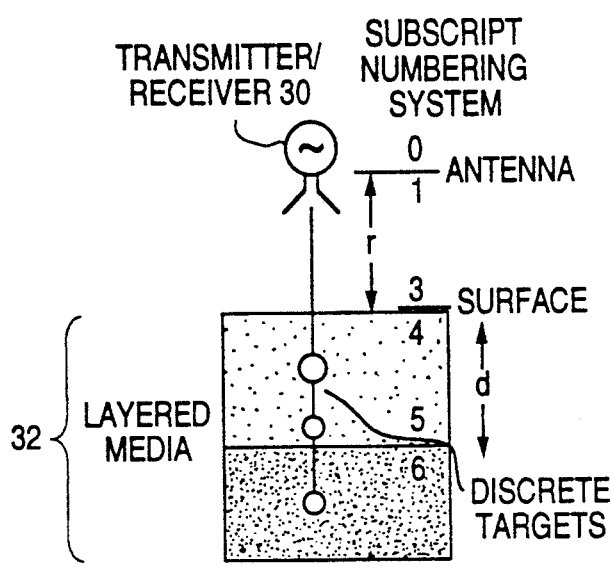
FIG. 3(a) is the one dimensional physical illustration of the problem.
Figure 3B:
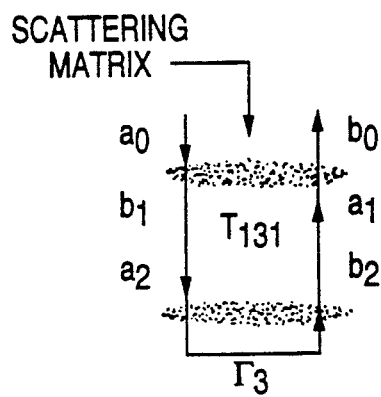
FIG. 3(b) is the scattering matrix representation of the problem.

The vectorial field is now reduced to one polarization and one spatial dimension, the Poynting vector. As shown in FIG. 3(a), a point source antenna 30 is positioned in free space, above a dielectric half-space 32, consisting of multiple layers and point scatterers all arranged in one spatial dimension. The subsurface layers and targets are reduced to a single complex reflection coefficient using the one layer theory from the diagram in FIG. 3(a):

$$\Gamma_3 = \frac{\Gamma_{34} + \Gamma_{56}e^{-jK_4 2d}}{1 + \Gamma_{34}\Gamma_{56}e^{-jK_4 2d}} \quad (3)$$

where $\Gamma_3$ is the reflection coefficient for the entire medium, $\Gamma_{34}$ is the reflectance at the 3–4 interface, $\Gamma_{56}$ is the reflectance at the 5–6 interface, and $K_4$ is equal to $2\pi n/\lambda$, where n is the complex refractive index of the first layer, encountered after surface 4. Using the one-dimensional, spherical wave, scattering matrix theory from the diagram in FIG. 3(b), $$\Gamma_3 = \left(T_{131}\left(\frac{S_{01}S_{10}}{M_{11} - S_{00}} + S_{11}\right)\right)^{-1} \quad (4)$$

where the spherical wave is given by $$T_{131} = \frac{e^{-j2Kr}}{2r} \quad (5)$$

Because the distance between antenna 30 and half-space 32 is small and variable, the wave is considered spherical in the sense that diffraction 1/r is included.

Figure 4A:
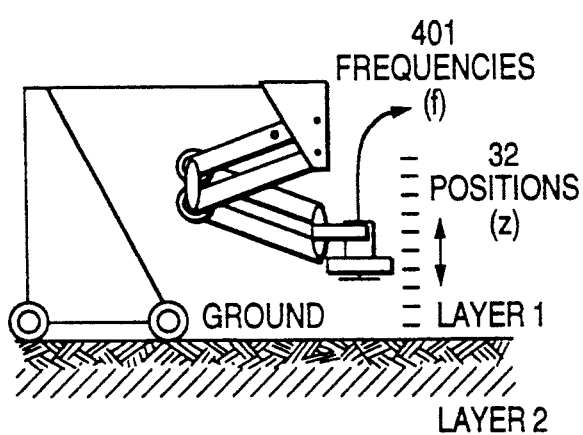
FIG. 4(a) shows the measurement apparatus used in the present invention.

The sensor concept of the present invention is to move the antenna perpendicularly with respect to the ground, resulting in the sequential spatial modulation in the Poynting vector direction. Such a scheme is shown in FIG. 4(a). This allows the sensor to detect targets in one dimension only, while excluding nuisance targets in three dimensions. For the sake of description, this target is a sub-surface layer of a different dielectric material from that of the top ground layer.

This process begins with a measurement of the input reflection coefficient $M_{11}$, with the antenna in close proximity to the surface of the ground. This measurement is taken at a wide range of frequencies and positions. For example, the sampling may be of 401 frequencies, between 600 and 1400 MHz, and 32 vertical positions, between 10 and 50 cm, from the surface. This can be accomplished using standard network analyzer test equipment and an antenna which is moved in space by a linear positioner.

The data from this measurement is a function of both frequency and position and is referred to as $M_{11}(f,z)$. The data is complex, containing both amplitude and phase information. A polar plot of typical data from one particular sensor position in the Poynting vector direction is given in FIG. 4(b). Each point along the curve represents a data point for a particular frequency in MHz, with the major frequency divisions denoted with tic marks.

Figure 4B:
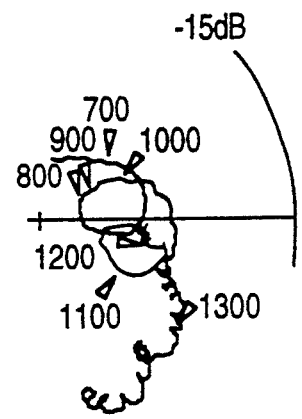
FIG. 4(b) is a plot of the frequency domain history for one position.
Figure 5:
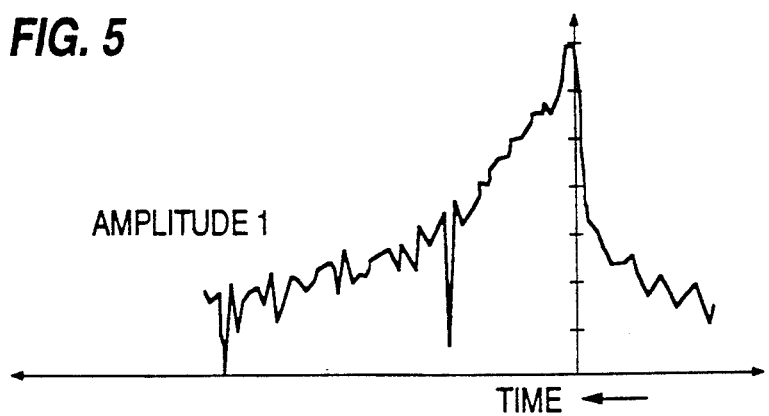
FIG. 5 is a plot of the time domain history for one position.

FIG. 5 shows the data in FIG. 4(b) transformed to the time domain. In this plot, the vertical dimension is the amplitude of the measurement and the horizontal dimension is time. The position of the vertical axis along the horizontal axis is referenced to the antenna, so that any signal received as a result of an interaction occurring in the distance from the antenna to the surface of the medium will be to the right of the axis, while the remaining interactions will appear to the left of the axis. The time component of the reflection coefficient is related to the distance of a target from a reference, here the antenna source. The absence of any sharp peaks in the space around the antenna indicates that the information for the ground surface is corrupted by other effects, such as the antenna dispersion, diffraction and multipath. These effects need to be characterized and accounted for in order to get good data for the ground surface. As shown in FIGS. 2(a) and 2(b), the information for subsurface targets is contained in the ground reflection coefficient.

Figure 6A:
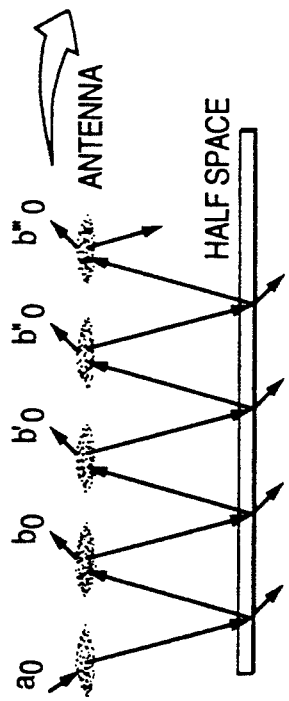
FIG. 6(a) depicts the antenna and its multiple reflections for one frequency.

In normal use, the antenna is close enough to the dielectric half-space that the transfer function of the antenna is important to the measurement. The antenna functions in the transmitter, receiver and scatter modes. Thus, the same antenna not only transmits and receives, but also acts as a point scatterer from its own reflection in the half-space, as shown in FIG. 6(a).

The antenna in this embodiment serves to measure the complex reflection coefficient $\Gamma$ referenced to the surface of the half-space; however, any of the antenna scattering functions could be measured. It is assumed that the antenna transfer functions are independent of the reflection from the half-space and antenna height above the half-space.

Figure 6B:
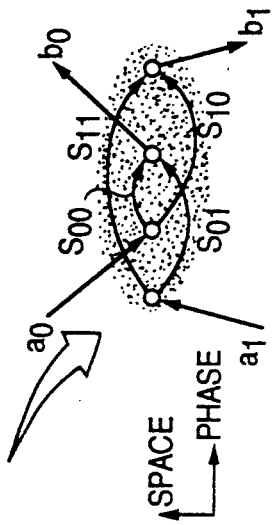
FIG. 6(b) depicts the single reflection scattering matrix for the antenna.

In order to integrate through the boundary, the boundary is characterized by four parameters of a scattering matrix, all of which may be measured experimentally:

$$\begin{bmatrix} b_0 \\ b_1 \end{bmatrix} = \begin{bmatrix} S_{00} & S_{01} \\ S_{10} & S_{11} \end{bmatrix} \begin{bmatrix} a_0 \\ a_1 \end{bmatrix} \quad (6)$$

Where $b_N$ is a reflected wave emerging from the boundary, $a_N$ is an incident voltage wave and $s_{NM}$ is an antenna scattering transfer function. The boundary is assumed to be a single point in space with four nodes, with two incident voltage waves and two reflected waves emerging from the nodes, as shown in FIG. 6(b). In between the four nodes are the four transfer functions, the S parameters of the matrix, which transfer the voltage waves to the other nodes. All four antenna nodes are collocated in space, but not in phase.

In a spherical wave scattering matrix, there are no ambiguous regions. The phase in space can be extrapolated back to a spot on the coax that is a very small fraction of a wavelength and sub-wavelength measurement, as demonstrated by the equations below;

$$M_{11} = \frac{b_0 + b_0' + b_0'' + \ldots}{a_0} \quad (7)$$

where the multiple reflections illustrated in FIG. 6(a) are represented by $b_0$ as the first reflected wave, $b_0'$ as the second reflected wave, $b_0''$ as the third reflected wave, etc.

$$M_{11} = S_{00} + S_{01} F_1 S_{10} R_{131} \quad (8)$$

where $$F_1 = \frac{1}{1 - S_{11} R_{131}} \quad (9)$$

when $$R_{131} = T_{131} \Gamma_3 \quad (10)$$

Figure 7:
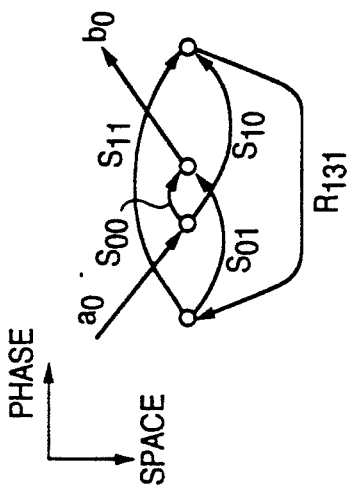
FIG. 7 is a phase space diagram for one position corresponding to all the reflections in 6(a)

Equation (7) defines the monostatic radar output in terms of transmitted and reflected waves. This definition is converted into measured $M_{11}$ in equation (8) via the scattering matrix from equation (6). FIG. 7 is a phase space diagram of equation (8), representing the model. The recursive term $F_1$ is due to the scattering of the antenna from its own reflection as shown in FIG. 6(a). This term is hard to measure and very troublesome if the transfer function $S_{11}$ is large. Placing an absorber on the backplane of a dipole antenna will reduce $S_{11}$.

Figure 8:
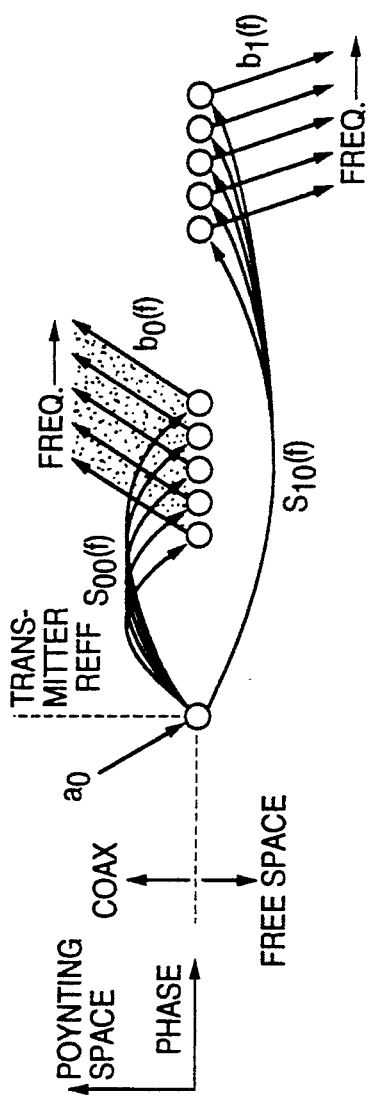
FIG. 8 shows the antenna with dispersion in phase space.
Figure 9A:
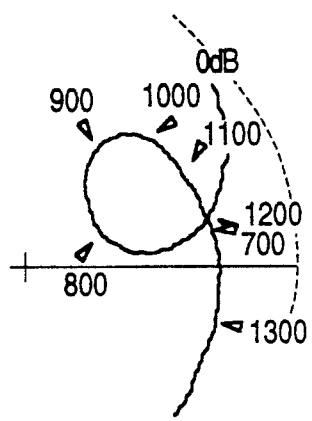
FIG. 9(a) is a plot of the frequency response of the free space antenna function $S_{00}$.
Figure 9B:
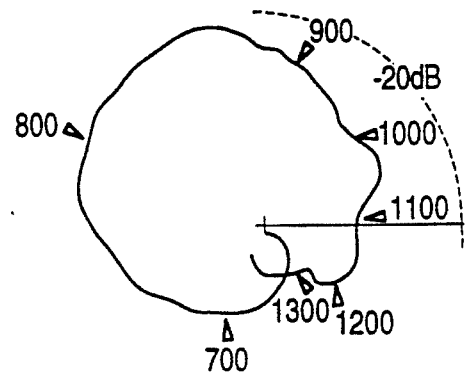
FIG. 9(b) is a plot of the frequency response of the function $S_{01}S_{10}$.

If the frequency is held constant and the height of the antenna above the half-space is varied, nothing in equation (8) will change except for $R_{131}$. If the frequency is varied, every quantity in equation (8) will change. This is due to antenna dispersion, i.e. the parameters are all frequency dependent. This dispersion is illustrated in phase space in FIG. 8. FIGS. 9(a) and 9(b) are typical full frequency responses of the antenna transfer functions, FIG. 9(a) showing $S_{00}$ and FIG. 9(b) showing $S_{01} S_{10}$.

Figure 10A:
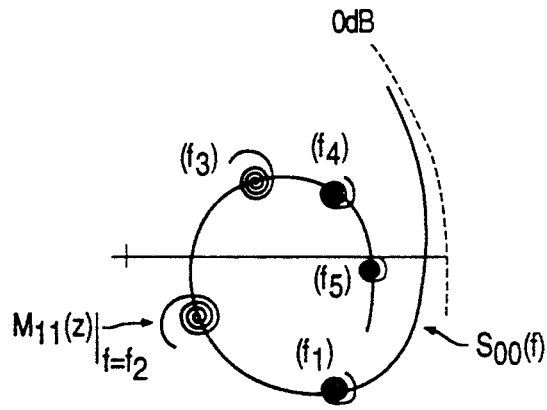
FIG. 10(a) is a plot of the free space transfer function and the radar output due to antenna position.
Figure 10B:
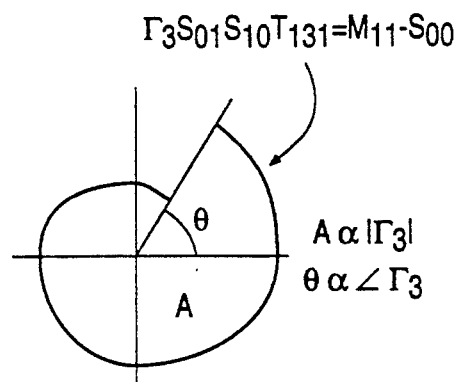
FIG. 10(b) is the spatial modulation spiral.

FIG. 10(a) shows both the free space transfer function $S_{00}(f)$ as a function of frequency and the radar output $M_{11}(z)$ as a function of height over a dielectric half-space. When monochromatic spatial modulation is used, wave diffraction is the largest amplitude variable and, combined with the spatial phase delay, causes the characteristic spiral. The spatial modulation spiral shown in FIG. 10(b) contains both the amplitude and the phase of the complex reflection coefficient, assuming the radar is calibrated.

To characterize the antenna, a separate test is run with a metal surface substituted for the ground surface. The same frequencies and positions are used. This provides data from a known reflection surface which yields the antenna transfer functions $S_{00}(f)$ and $S_{01}(f)S_{10}(f)$. These functions are used in removing antenna dispersion from the measured data $M_{11}$, given by;

$$\Sigma T_{1n1} \Gamma_n = \frac{M_{11} - S_{00}}{S_{01} S_{10}} \quad (11)$$

When the antenna transfer functions are accounted for in the data $M_{11}$, the result is the product of the term embodying diffraction and propagation delay induced phase shift $T_{131}$ and the ground surface reflection coefficient, $\Gamma_3(f,z)$. The summation symbol indicates that other reflections, i.e. multipath, are present in this expression.

Dividing both sides of equation (11) by the spatial delay term $T_{131}$, shifts the image plane to the surface of the ground and removes diffraction. The antenna-to-surface-to-antenna distance is known.

$$\Gamma_3 + \overset{n}{\Sigma} \frac{T_{1n1}}{T_{131}} \Gamma_n = \frac{M_{11} - S_{00}}{T_{131} S_{01} S_{10}} \quad (12)$$

This quantity can be averaged over all of the various positions at which the frequency variations were measured.

$$E[\Gamma_3] = \frac{1}{32} \sum_{z=1}^{32} \left( \frac{M_{11} - S_{00}}{T_{131} S_{01} S_{10}} - \sum_{n=1}^{n} \frac{T_{1n1}}{T_{131}} \Gamma_n \right) \quad (13)$$

By integrating equation (13) over space, the second term in the parentheses, the multipath term, can be decorrelated. Since spatial integration is coherent with the layer interface, but not coherent with any other spatial distances, the multipath will become zero, or at least very small compared to the interface reflection. The spatial integration thus provides a true reflection coefficient $\Gamma_3(f)$ which is only a function of the frequency. A plot of the true reflection coefficient is shown in FIG. 11(a).

Figure 11B:
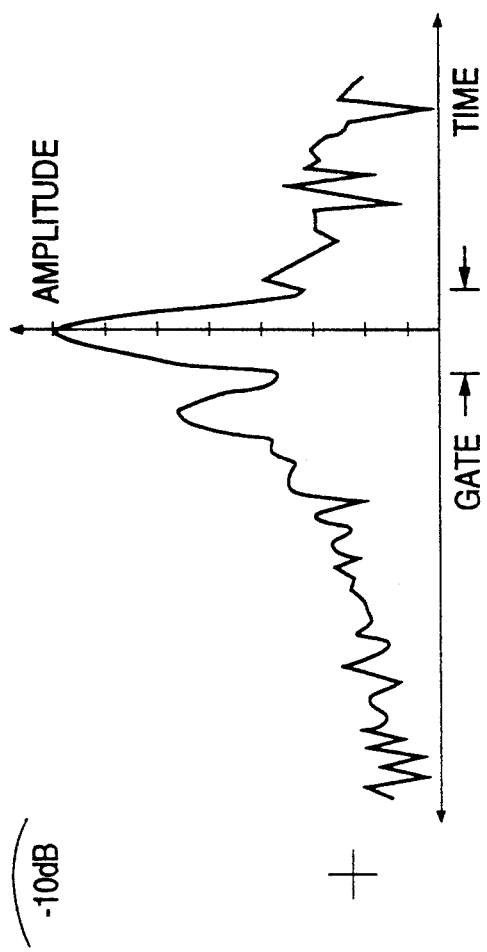
FIG. 11(b) is a plot of the measured reflection coefficient in the time domain.
Figure 11A:
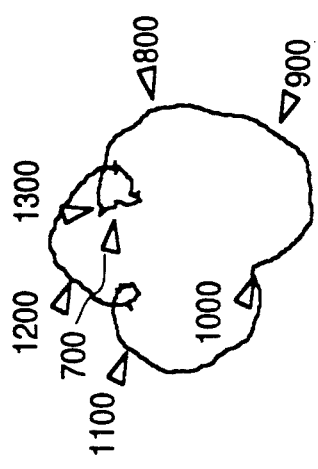
FIG. 11(a) is a plot of the measured reflection coefficient in the frequency domain.

Transforming the true reflection coefficient into the time domain results in the plot shown in FIG. 11(b). The vertical axis is now referenced to the surface of the ground. A strong peak is now evident. The smaller peak to the left represents information present from an unwanted reflection approximately 56 inches away in air or 18 inches away in soil, i.e. from a second layer. The plots shown in FIG. 5 and in FIG. 11(b) are both taken from the same data set. The improvement is obvious.

The unwanted reflections, like those from the second layer, in FIG. 11(b) can be removed from the data by gating out all information on either side of the main peak in the time domain. This gate, typically about 15 inches into the media, is shown at the bottom of FIG. 11(b).

Figure 12B:
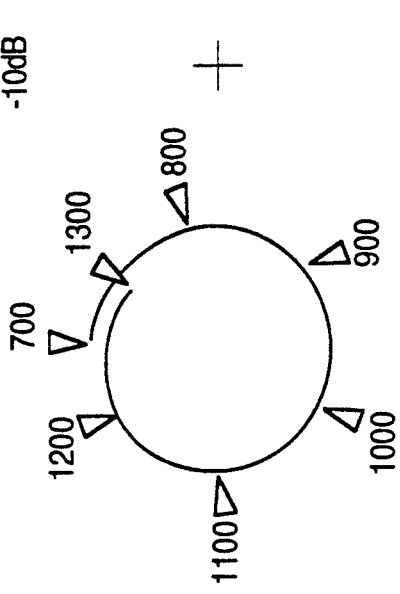
FIG. 12(b) is a plot of a theoretical reflection coefficient in the frequency domain.
Figure 12A:
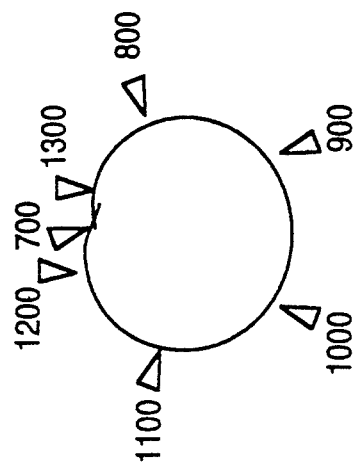
FIG. 12(a) is a plot of the measured gated reflection coefficient in the frequency domain.

Transforming the reflection coefficient back to the frequency domain after gating yields the composite reflection coefficient for just the reflections within the range gate. This is shown in FIG. 12(a). This is a dispersive target, that is the front surface reflection can not be separated from the back surface reflection and there is a propagation velocity difference between the two paths.

This measured reflection coefficient can now be correlated with theoretical reflection coefficients for various thicknesses and dielectric constants. The one which correlates best provides the thickness and dielectric constant of the ground being measured. The theoretical reflection coefficient which correlates best for this example is shown in FIG. 12(b). The layer thickness for the theoretical reflection coefficient is 5.3 inches and the material has a dielectric constant of 4 and a loss tan of 0.03. The actual thickness of the layer measured in the example was about 6 inches. The coal dielectric was independently confirmed with a permittivity probe to be 3.92-j0.12. These measurements were taken using a radar with a synthetic pulse width of 100 inches.

Figure 13:
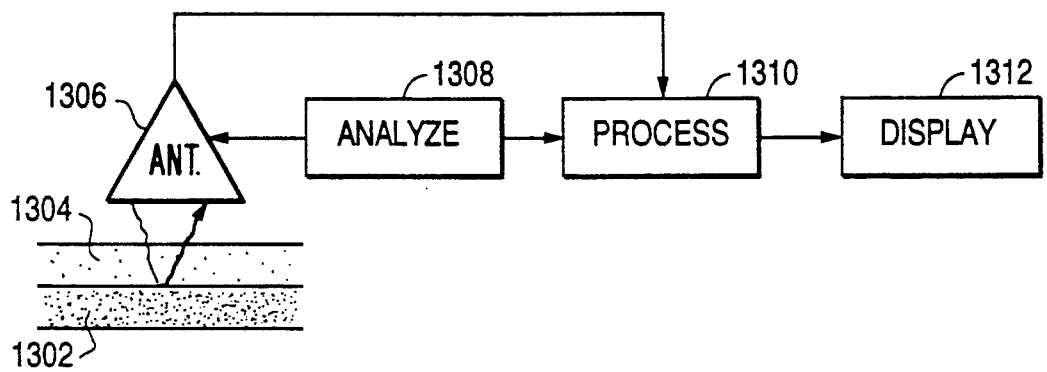
FIG. 13 is a block diagram of the characterization apparatus.

This method can be realized using the apparatus shown in FIG. 13. Antenna 1306, which acts as both the transmitter and receiver, sends an electro-magnetic wave, typically in the microwave region, towards the medium. A subsurface target 1302 reflects the electromagnetic wave back to the antenna 1306. Vector network analyzer 1308 varies the frequencies and positions over which the measurements are taken. These measured signals are then sent to processor 1310. Vector network analyzer 1308 provides processor 1310 with the distance from the antenna to the surface 1304 and with the frequency of the wave being transmitted by the antenna. Processor 1310 outputs the characterization of subsurface target 1302, which is displayed on display unit 1312.

Figure 14:
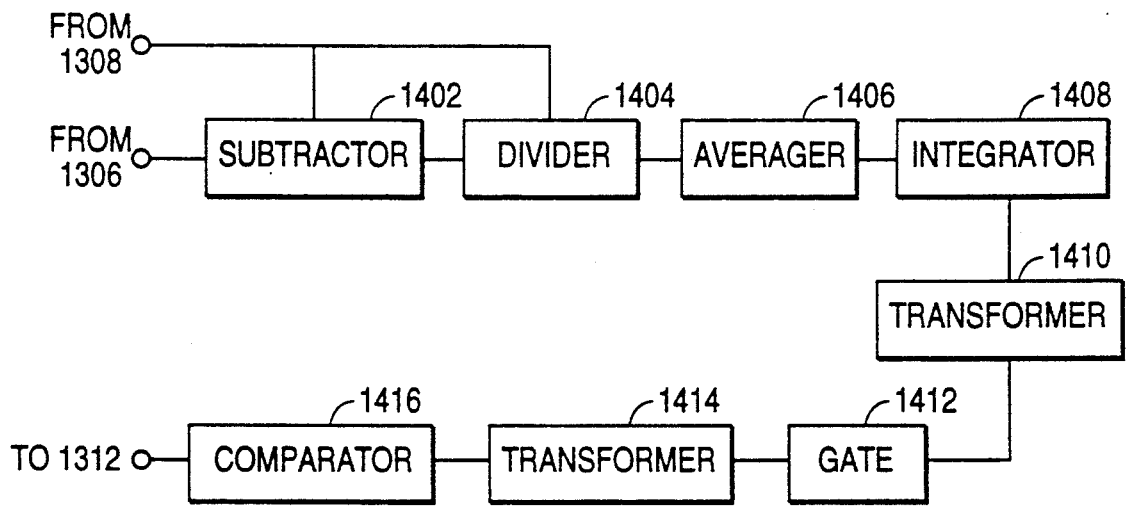
FIG. 14 is a block diagram of the processing unit in FIG. 13.

The basic structure of the processor 1310 is shown in FIG. 14. Subtractor 1402 removes the antenna transfer function in free space $S_{00}$, from the data received from the antenna. As noted previously, the antenna transfer functions can be determined from previous calibrations. The input from the vector network analyzer is required, since the antenna transfer functions are frequency dependent. Additionally using the distance output from the vector network analyzer, divider 1404 divides the quantity output from the subtractor by the product of $T_{131}$, $S_{01}$, and $S_{10}$.

Once all of the antenna transfer functions and the diffraction have be removed, averager 1406 averages the quantity output from the divider over the number of positions at which the frequency variations were measured. Integrator 1408 then integrates this averaged quantity over space, resulting in a reflection coefficient which only depends on frequency. Transformer 1410 transforms this coefficient from the frequency domain into the time domain. Gate 1412 removes all information on either side of the main peak in the time domain. Transformer 1414 transforms this gated signal back into the frequency domain. Comparator 1416 compares the cleaned up coefficient to reflection coefficients for targets with known characteristics, and outputs the characteristics corresponding to the target whose reflection coefficient most closely resembles the measured coefficient.

Although the invention has been described above with respect to certain specific embodiments, the scope of the invention is not limited to these specific embodiments. For example, the invention is not limited to detecting coal in ground. Rather, this invention could be used to locate and parameterize a target having dielectric properties which differ from its surrounding medium. This method would work equally well for finding the dielectric change in ground due to a plastic mine or a pipeline gas leak, since a change in dielectric constant will change the physical wavelength, producing a result similar to a change in thickness.

Other designs within the spirit and scope of this invention will be apparent to those skilled in the field after receiving the above teachings. The invention, therefore, is defined with reference to the following claims.

What is claimed is:

1. A method for characterizing a target within a medium, comprising the steps of:
    a) radiating an unmodulated electro-magnetic wave from an electro-magnetic wave source towards said medium;
    b) changing the frequency of said electro-magnetic wave over a plurality of successive frequencies;
    c) measuring electro-magnetic waves reflected from said medium at said plurality of successive frequencies for a single perpendicular distance form said medium to said electro-magnetic wave source to produce measured signals, respectively;
    d) processing said measured signals to obtain a reflection coefficient dependent on both frequency of said electro-magnetic wave and said perpendicular distance;
    e) repeating steps c) and d) to produce a plurality of reflection coefficients for a predetermined number of perpendicular distances;
    f) averaging all said reflection coefficients over said predetermined number; and
    g) integrating said averaged reflection coefficients over space, resulting in a true reflection coefficient which is only a function of frequency.

2. A method as recited in claim 1, further comprising the steps of:
   h) comparing said true reflection coefficient with theoretical reflection coefficients for respective objects each having known characteristics; and
   i) outputting said known characteristics of an object which correlates best with said target based on said comparing step.

3. A method as recited in claim 1, wherein said processing step comprises the steps of:
   correcting said measured signals by removing antenna dispersion to produce corrected signals; and
   dividing said corrected signals by a spatial delay term.

4. A method as recited in claim 2, wherein said comparing step further comprises the steps of:
   transforming said true reflection coefficient into a time domain;
   gating out all information on either side of a range centered on a main peak in said time domain to produce a gated true reflection coefficient; and
   transforming said gated true reflection coefficient back to a frequency domain for comparison with said theoretical reflection coefficients.

5. A method as recited in claim 2, wherein said target is characterized by thickness and dielectric constant.

6. An apparatus for characterizing a target within a medium, comprising:
   an antenna for both transmitting electro-magnetic waves at different unmodulated carrier frequencies towards said medium and receiving reflected electro-magnetic waves from said medium; and
   means for processing said reflected electro-magnetic waves comprising
      means for obtaining, from said reflected electro-magnetic waves, a true reflection coefficient dependent only on said frequencies;
      means for comparing said true reflection coefficient with theoretical reflection coefficients for respective objects, each of said object having known characteristics and
      means for outputting said known characteristics of an object which said comparing means determines correlates best with said target.

7. An apparatus as recited in claim 6, wherein said obtaining means comprises:
   means for accounting for antenna transfer functions in said reflected electro-magnetic waves to produce accounted signals;
   means for dividing said accounted signals by a spatial delay term and outputting reflection coefficients dependent on both said frequencies of said electro-magnetic waves and distance between said antenna and said medium;
   means for averaging said reflection coefficients over a number of distances over which signals were received to produce an averaged reflection coefficient; and
   means for integrating said averaged reflection coefficient over space.

8. An apparatus as recited in claim 6, further comprising:
   means, receiving said true reflection coefficient and outputting a clean true reflection coefficient to said comparing means, for removing unwanted reflections comprising
      means for transforming said clean true reflection coefficient into a time domain
      means for gating out all information on either side of a range centered on a main peak in said time domain to produce a gated true reflection coefficient and
   means for transforming said gated true reflection coefficient back to a frequency domain.

9. An apparatus as recited in claim 6, wherein said target is characterized by thickness and dielectric constant.

10. A method for characterizing a target within a medium, comprising the steps of:
   a) successively radiating electro-magnetic waves from a source towards said medium, said source being at a single perpendicular distance from said medium, said electro-magnetic waves being at different frequencies, respectively, and each of said electro-magnetic waves being unmodulated;
   b) successively receiving reflected electro-magnetic waves from said medium at said single perpendicular distance, said reflected electro-magnetic waves being at said different frequencies, respectively;
   c) converting said reflected electro-magnetic waves to received signals, respectively;
   d) processing each of said received signals to produce a respective reflection coefficient dependent on each frequency of said reflected electro-magnetic waves and said single perpendicular distance;
   e) repeating steps a) to d) for a plurality of additional perpendicular distances to produce additional reflection coefficients, said single perpendicular distance and said additional perpendicular distances together constituting a predetermined number of perpendicular distances;
   f) averaging all said reflection coefficients over said predetermined number to produce an averaged reflection coefficient; and
   g) integrating said averaged reflection coefficient over space to produce a true reflection coefficient, which is a function of only frequency, to output characteristics of a known reflection coefficient which compares best with said true reflection coefficient.

11. An apparatus for characterizing a target within a medium, comprising:
   antenna means for radiating a plurality of transmitted electro-magnetic waves to said medium at each of a number of perpendicular distances from said medium, said transmitted electro-magnetic waves being at successive frequencies and each of said transmitted electro-magnetic waves being unmodulated, said antenna means receiving reflected electro-magnetic waves from said medium including said target, each of said reflected electro-magnetic waves corresponding to one of said transmitted electro-magnetic waves, and said antenna means converting said reflected electro-magnetic waves into respective received signals;
   means for processing said received signals to produce a plurality of reflection coefficients, each of said reflection coefficients being for each of said number of perpendicular distances, for averaging said reflection coefficients over said number to obtain a true reflection coefficient, and for comparing said true reflection coefficient with known reflection coefficients for specific objects to output known characteristics of one of said specific objects which has a known reflection coefficient which best compares with said true reflection coefficient.

* * * * *